(12) United States Patent
Cheng et al.

(10) Patent No.: US 10,985,022 B2
(45) Date of Patent: Apr. 20, 2021

(54) GATE STRUCTURES HAVING INTERFACIAL LAYERS

(71) Applicant: Taiwan Semiconductor Manufacturing Co., Ltd., Hsinchu (TW)

(72) Inventors: Chung-Liang Cheng, Changhua County (TW); Chun-I Wu, Hsinchu (TW); Ziwei Fang, Baoshan Township (TW); Huang-Lin Chao, Hillsboro, OR (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 233 days.

(21) Appl. No.: 16/203,744

(22) Filed: Nov. 29, 2018

(65) Prior Publication Data
US 2020/0135475 A1    Apr. 30, 2020

Related U.S. Application Data

(60) Provisional application No. 62/751,055, filed on Oct. 26, 2018.

(51) Int. Cl.
*H01L 21/28* (2006.01)
*H01L 21/8234* (2006.01)
(Continued)

(52) U.S. Cl.
CPC .. *H01L 21/28185* (2013.01); *H01L 21/28088* (2013.01); *H01L 21/3115* (2013.01);
(Continued)

(58) Field of Classification Search
CPC .......... H01L 29/4966; H01L 21/28088; H01L 21/324; H01L 21/823842;
(Continued)

(56) References Cited

U.S. PATENT DOCUMENTS

| 6,287,897 B1 | 9/2001 | Gousev et al. |
|---|---|---|
| 8,772,109 B2 | 7/2014 | Colinge |

(Continued)

FOREIGN PATENT DOCUMENTS

| JP | 2001274393 | 10/2001 |
|---|---|---|
| KR | 20060103805 | 10/2006 |

(Continued)

*Primary Examiner* — Savitri Mulpuri
(74) *Attorney, Agent, or Firm* — Haynes and Boone, LLP

(57) ABSTRACT

Examples of a method of forming an integrated circuit device with an interfacial layer disposed between a channel region and a gate dielectric are provided herein. In some examples, the method includes receiving a workpiece having a substrate and a fin having a channel region disposed on the substrate. An interfacial layer is formed on the channel region of the fin, and a gate dielectric layer is formed on the interfacial layer. A first capping layer is formed on the gate dielectric layer, and a second capping layer is formed on the first capping layer. An annealing process is performed on the workpiece configured to cause a first material to diffuse from the first capping layer into the gate dielectric layer. The forming of the first and second capping layers and the annealing process may be performed in the same chamber of a fabrication tool.

20 Claims, 15 Drawing Sheets

(51) Int. Cl.
*H01L 21/324* (2006.01)
*H01L 21/3115* (2006.01)

(52) U.S. Cl.
CPC ...... *H01L 21/324* (2013.01); *H01L 21/82345* (2013.01); *H01L 21/823431* (2013.01); *H01L 21/823462* (2013.01)

(58) Field of Classification Search
CPC ....... H01L 21/823431; H01L 21/02332; H01L 21/823821; H01L 27/0924; H01L 21/823462; H01L 29/66795; H01L 21/28185; H01L 27/092; H01L 21/3115; H01L 21/82345; H01L 21/823807
See application file for complete search history.

(56) References Cited

U.S. PATENT DOCUMENTS

| | | |
|---|---|---|
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2006/0214243 A1 | 9/2006 | Sakoda et al. |
| 2013/0299914 A1 | 11/2013 | Kim |
| 2014/0167187 A1* | 6/2014 | Kuo ................... H01L 21/02205 257/411 |
| 2016/0013107 A1 | 1/2016 | Won et al. |
| 2018/0122709 A1* | 5/2018 | Xie ................... H01L 21/28556 |
| 2019/0139759 A1* | 5/2019 | Cheng ............... H01L 21/02321 |
| 2019/0393326 A1* | 12/2019 | Chiang ............... H01L 29/4966 |

FOREIGN PATENT DOCUMENTS

| | | |
|---|---|---|
| KR | 20130127257 | 11/2013 |
| KR | 20160007115 | 1/2016 |
| TW | 201125044 | 7/2011 |
| TW | 201243918 | 11/2012 |
| TW | 201732904 | 9/2017 |
| TW | 201802894 | 1/2018 |
| TW | 201814793 | 4/2018 |

\* cited by examiner

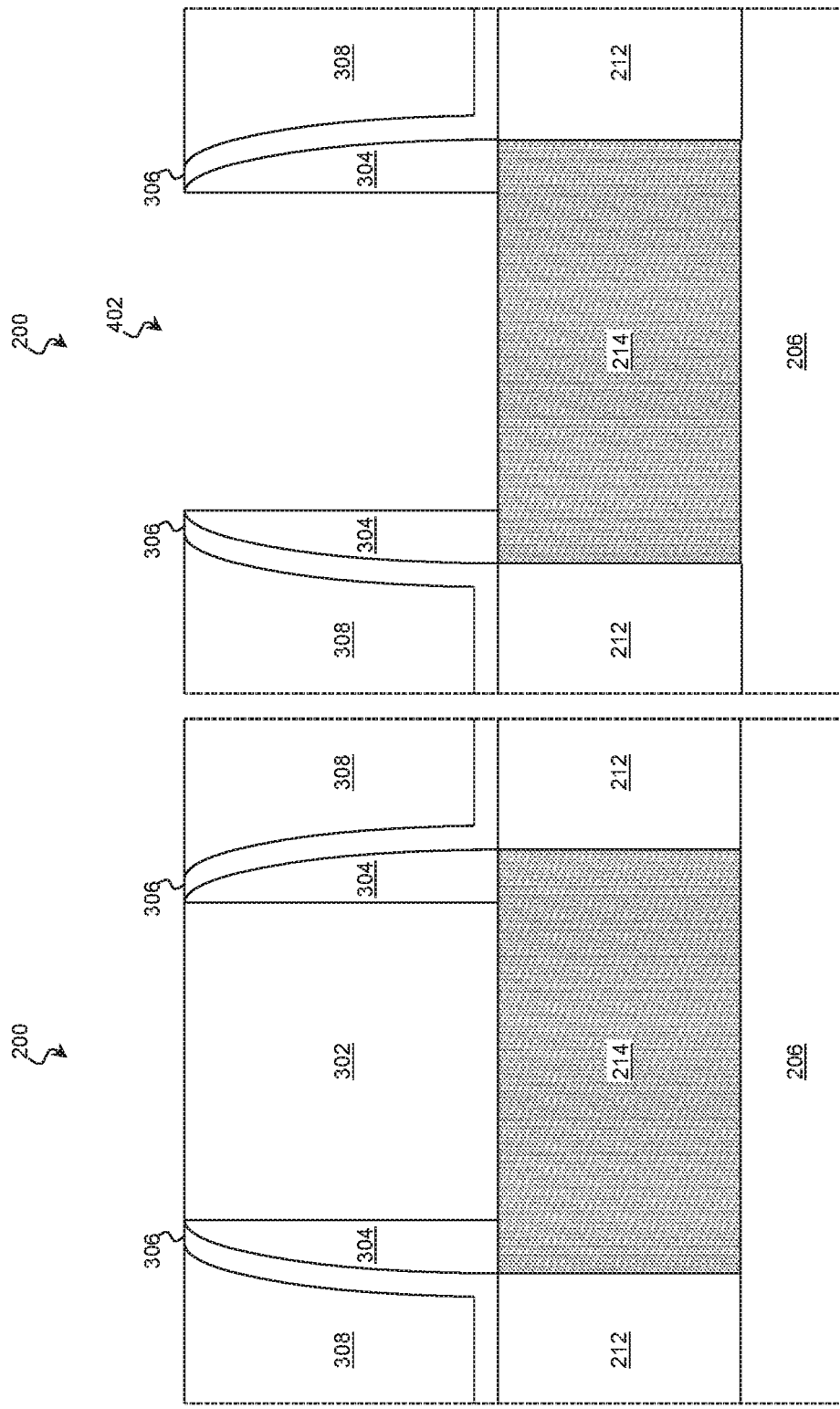

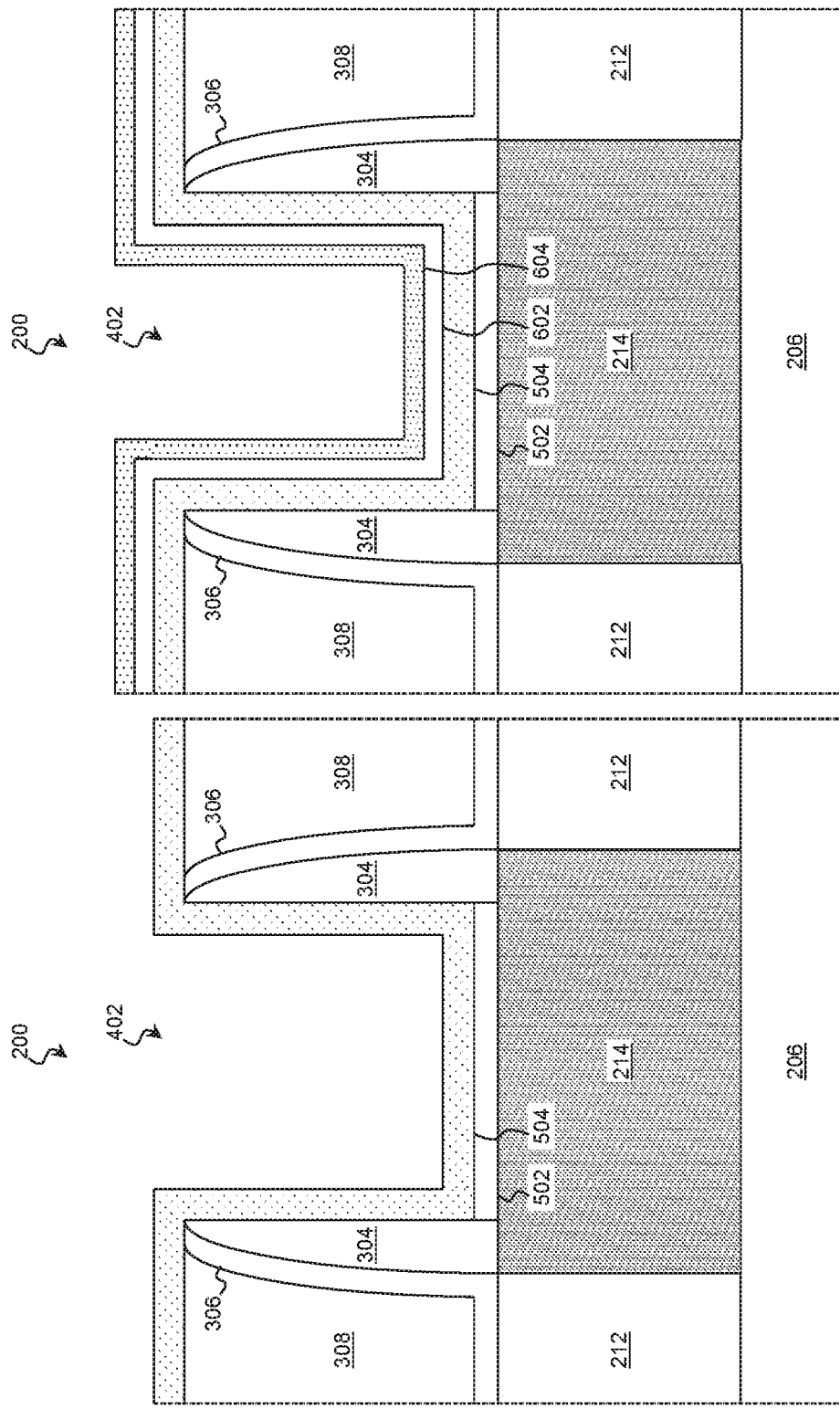

GATE STRUCTURES HAVING INTERFACIAL LAYERS

PRIORITY DATA

The present application claims the benefit of U.S. Provisional Application No. 62/751,055, entitled "Gate Structures Having Interfacial Layers," filed Oct. 26, 2018, herein incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, each iteration of size reduction presents greater challenges to both design and manufacturing. Through advances in these areas, increasingly complex designs are being fabricated with precision and reliability.

For example, the materials and techniques used to form a gate structure of a transistor have continued to evolve. At a high level, a gate structure may include a conductor and a gate dielectric that separates the conductor from a channel region of the transistor. One common gate dielectric is silicon oxide. While thinning a silicon oxide gate dielectric improves channel current and improves a transistor's switching speed, a thinner gate dielectric is also more susceptible to tunneling and has a greater gate leakage. For these reasons and others, silicon oxide gate dielectrics have been replaced, in part, by high-k dielectric materials for better transistor performance. However, high-k dielectric materials may be difficult to fabricate and prone to defects, particularly where they interface with other materials.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3-15 are cross-sectional views of a workpiece taken along a first cross-sectional plane at various points in a method of fabrication according to various aspects of the present disclosure.

DETAILED DESCRIPTION

Figure 1A:
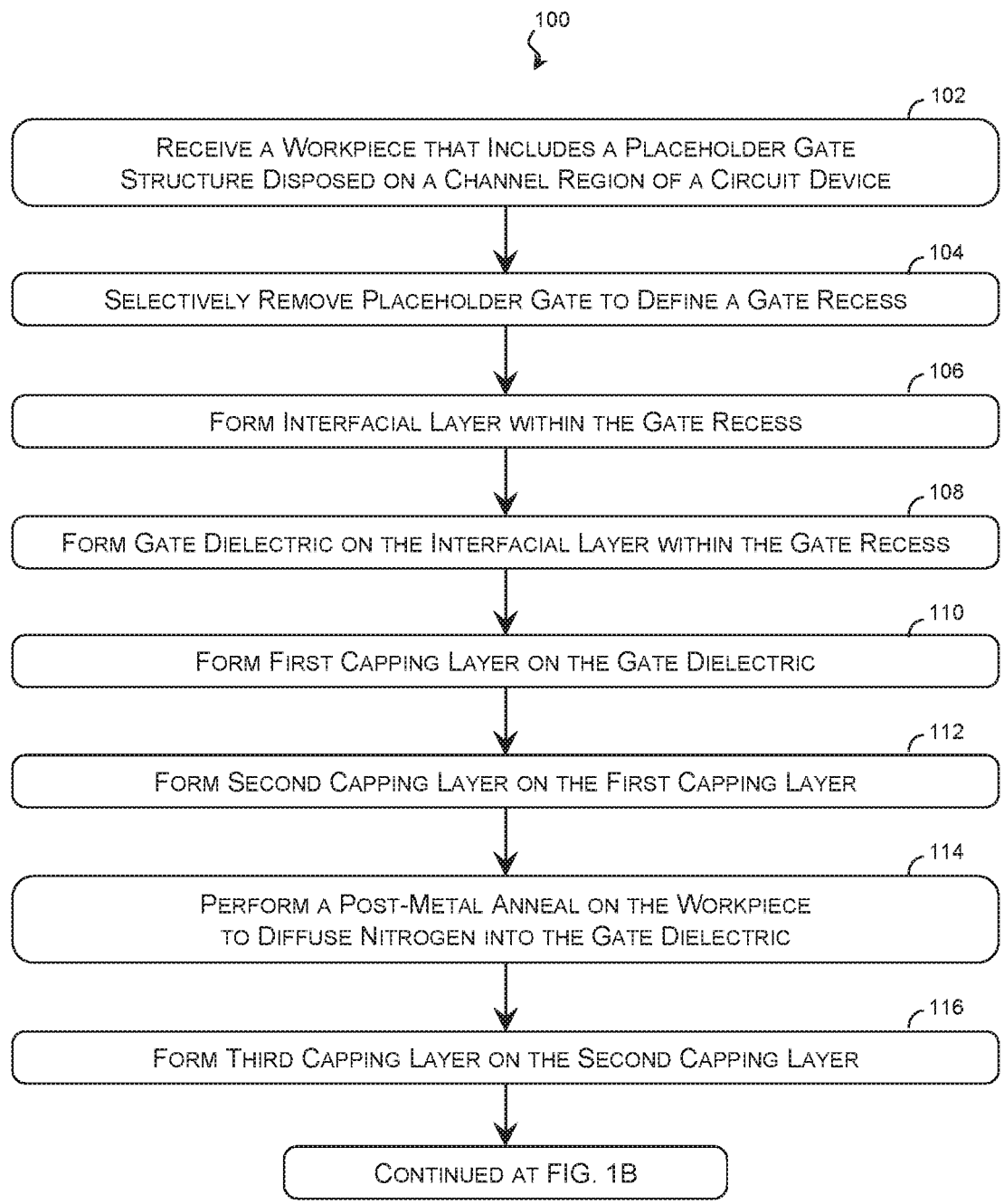
FIGS. 1A and 1B are flow diagrams of a method of fabricating a semiconductor device with a gate structure having an interfacial layer according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature connected to and/or coupled to another feature in the present disclosure that follows may include embodiments in which the features are formed in direct contact, and may also include embodiments in which additional features may be formed interposing the features, such that the features may not be in direct contact.

In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. In addition, the present disclosure may repeat reference numerals and/or letters in the various examples. This repetition is for the purpose of simplicity and clarity and does not in itself dictate a relationship between the various embodiments and/or configurations beyond the extent noted.

At its most basic, a transistor may include a semiconductor doped to form source/drain features separated by a channel region. A gate structure is disposed on the channel region and includes a gate electrode and a gate dielectric separating the gate electrode and the channel region. While any suitable gate dielectric may be used, many examples of the present disclosure use a high-k gate dielectric to reduce leakage current, reduce threshold voltage, and/or optimize the operation of the transistor.

However, some high-k materials may not form a uniform, defect-free interface if applied directly to the semiconductor of the channel region. To address this, an interfacial layer may be formed on the semiconductor before the high-k material is deposited. The interfacial layer may reduce oxygen vacancies and other defects in the high-k material, particularly at the interface. The interfacial layer may also improve thermal stability, reduce tunneling through the high-k material, and improve carrier mobility through the channel region. However, these benefits must be weighed against the costs. The interfacial layer contributes to the gate capacitance and decreases the responsiveness of the device. In some examples, device current through the channel region and switching speed decrease as the interfacial layer becomes thicker.

For these reasons and other, the technique of the present disclosure forms an interfacial layer between a channel region and a high-k gate dielectric and prevents unintended oxidation that would otherwise increase the thickness of the interfacial layer. Some examples also diffuse oxygen out of the interfacial layer to reduce the thickness of the interfacial layer. In these examples and others, the technique provides precise control over the thickness of the interfacial layer to allow the manufacturer to balance the costs and benefits of the interfacial layer to provide improved device performance, uniformity, and reliability. However, unless otherwise noted, no embodiment is required to provide any particular advantage.

Figure 1B:
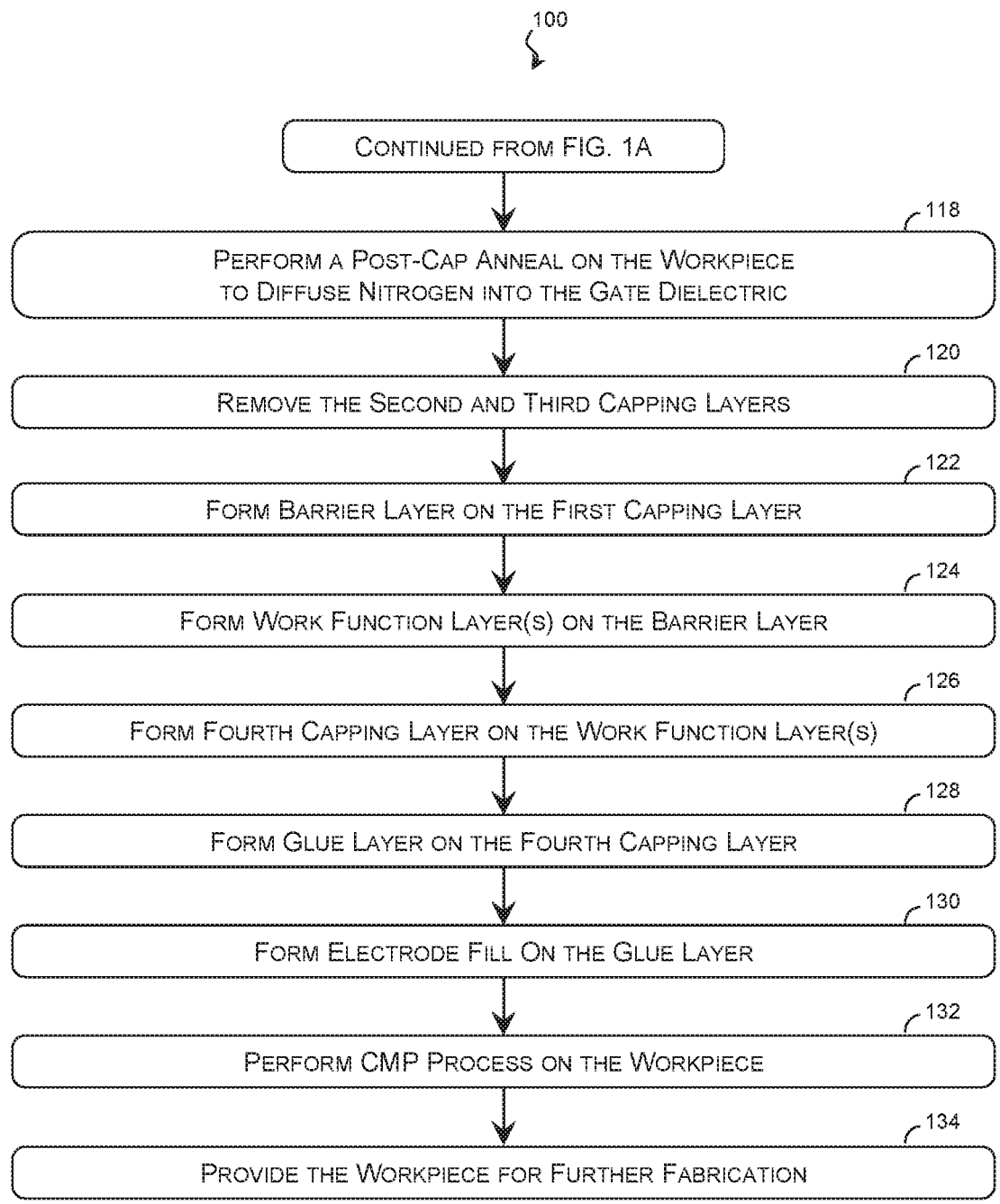

The techniques of the present disclosure may be used to form a variety of planar and non-planar devices. Examples of a Fin-like Field Effect Transistors (FinFET) and a method of forming such are described with reference to FIGS. 1A-15. In that regard, FIGS. 1A and 1B are flow diagrams of a method 100 of fabricating a semiconductor device with a gate structure having an interfacial layer according to various aspects of the present disclosure. Additional steps can be provided before, during, and after the method 100, and some of the steps described can be replaced or eliminated for other embodiments of the method 100.

Figure 2:
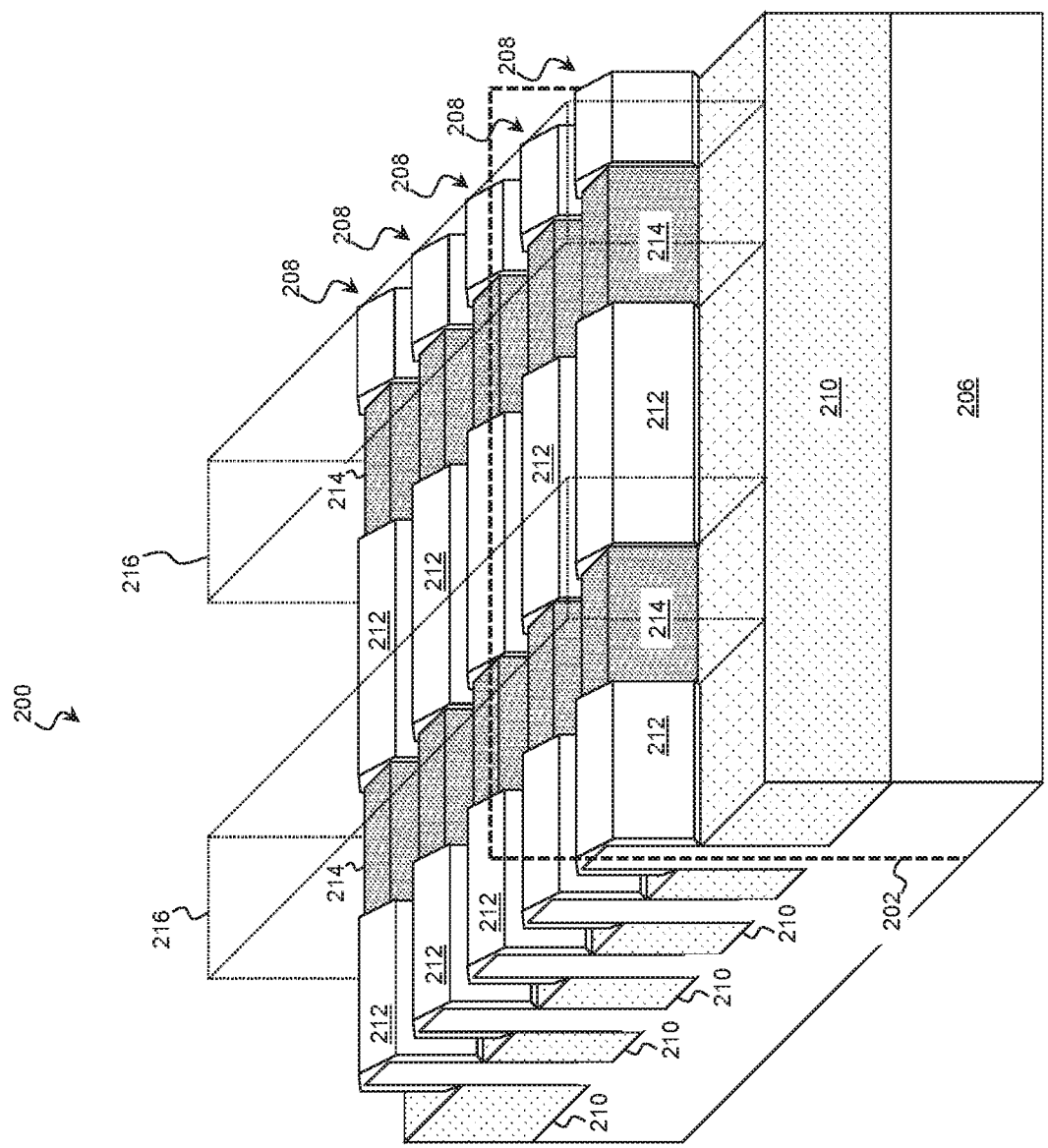
FIG. 2 is a perspective view of a workpiece undergoing a method of fabrication according to various aspects of the present disclosures.

FIG. 2 is a perspective view of a workpiece 200 undergoing the method 100 according to various aspects of the present disclosures. FIGS. 3-15 are cross-sectional views of the workpiece 200 taken along a first cross-sectional plane (plane 202 of FIG. 2) at various points in the method 100 according to various aspects of the present disclosure. FIGS. 2-15 have been simplified for the sake of clarity and to better illustrate the concepts of the present disclosure. Additional features may be incorporated into the workpiece 200, and some of the features described below may be replaced or eliminated for other embodiments of the workpiece 200.

Referring to block 102 of FIG. 1A and to FIG. 2, the workpiece 200 is received. The workpiece 200 includes a substrate 206 upon which devices are to be formed. In various examples, the substrate 206 includes an elementary (single element) semiconductor, such as silicon or germanium in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof.

The substrate 206 may be uniform in composition or may include various layers, some of which may be selectively etched to form fins. The layers may have similar or different compositions, and in various embodiments, some substrate layers have non-uniform compositions to induce device strain and thereby tune device performance. Examples of layered substrates also include silicon-on-insulator (SOI) substrates 206. In some such examples, an insulator layer of an SOI substrate 206 includes a semiconductor oxide, a semiconductor nitride, a semiconductor oxynitride, a semiconductor carbide, and/or other suitable insulator materials.

In some examples, the devices to be formed on the substrate 206 extend out of the substrate 206. For example, FinFETs and/or other non-planar devices may be formed on device fins 208 disposed on the substrate 206. The device fins 208 are representative of any raised feature and include FinFET device fins 208 as well as fins 208 for forming other raised active and passive devices upon the substrate 206. The fins 208 may be formed by etching portions of the substrate 206, by depositing various layers on the substrate 206 and etching the layers, and/or by other suitable techniques. For example, the fins 208 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The fins 208 may be similar in composition to the substrate 206 or may be different therefrom. For example, in some embodiments, the substrate 206 includes primarily silicon, while the fins 208 include one or more layers that are primarily germanium or a SiGe semiconductor. In some embodiments, the substrate 206 includes a SiGe semiconductor, and the fins 208 include one or more layers that include a SiGe semiconductor with a different ratio of silicon to germanium.

The fins 208 may be physically and electrically separated from each other by isolation features 210, such as a shallow trench isolation features (STIs). In various examples, the isolation features 210 include dielectric materials such as semiconductor oxides, semiconductor nitrides, semiconductor carbides, FluoroSilicate Glass (FSG), low-k dielectric materials, and/or other suitable dielectric materials.

Each device fin 208 may include any number of circuit devices, such as FinFETs, that, in turn, each include a pair of opposing source/drain features 212 separated by a channel region 214. The source/drain features 212 may include a semiconductor (e.g., Si, Ge, SiGe, etc.) and one or more dopants, such as p-type dopants (e.g., boron, $BF_2$, or indium) or n-type dopants (e.g., phosphorus or arsenic). Similarly, the channel region 214 may include a semiconductor and one or more dopants of the opposite type of those of the source/drain features 212.

The flow of carriers (electrons for an n-channel FinFET and holes for a p-channel FinFET) through the channel region 214 is controlled by a voltage applied to a gate structure adjacent to and overwrapping the channel region 214. To avoid obscuring other elements, the location of the gate structure is indicated by a transparent marker 216 in FIG. 2.

Referring to FIG. 3, a portion of the received workpiece 200 is shown in more detail. The workpiece 200 includes a placeholder gate structure 302 disposed on the channel region 214 of the fin 208. When materials of the functional gate structure are sensitive to fabrication processes or are difficult to pattern, a placeholder gate structure 302 of polysilicon, dielectric, and/or other resilient materials may be used during some of the fabrication processes. The placeholder gate structure 302 is later removed and replaced with elements of a functional gate (e.g., an interfacial layer, a gate dielectric layer, a gate electrode, etc.) in a gate-last process. Until this time, the placeholder gate structure 302 reserves a space for the functional gate and provides a framework for other materials to be applied.

For example, sidewall spacers 304 are disposed on the side surfaces of the placeholder gate structure 302. In various examples, the sidewall spacers 304 include one or more layers of suitable materials, such as a dielectric material (e.g., a semiconductor oxide, a semiconductor nitride, a semiconductor oxynitride, a semiconductor carbide, a semiconductor oxycarbonitride, etc.), Spin On Glass (SOG), tetraethylorthosilicate (TEOS), Plasma Enhanced Chemical Vapor Deposition oxide (PE-oxide), High-Aspect-Ratio-Process (HARP)-formed oxide, and/or other suitable material. In one such embodiment, the sidewall spacers 304 each include a first layer of silicon oxide, a second layer of silicon nitride disposed on the first layer, and a third layer of silicon oxide disposed on the second layer. In the embodiment, each layer of the sidewall spacers 304 has a thickness between about 1 nm and about 10 nm.

The workpiece 200 may also include a contact-etch stop layer (CESL) 306 disposed alongside the sidewall spacers 304 and on the source/drain features 212. The CESL 306 may include a dielectric (e.g., a semiconductor oxide, a semiconductor nitride, a semiconductor oxynitride, a semiconductor carbide, etc.) and/or other suitable material, and in various embodiments, the CESL 306 includes SiN, SiO, SiON, and/or SiC. In some examples, the CESL 306 has a thickness between about 1 nm and about 50 nm.

An Inter-Level Dielectric (ILD) layer 308 is disposed on the CESL 306 and on source/drain features 212 of the workpiece 200. The ILD layer 308 acts as an insulator that supports and isolates conductive traces. In later processes, multiple ILD layers 308 are deposited on top of one another to form a multi-level interconnect structure that electrically interconnects elements of the workpiece 200, such as the source/drain features 212 and the functional gate structures. Each ILD layer 308 may include a dielectric material (e.g., a semiconductor oxide, a semiconductor nitride, a semiconductor oxynitride, a semiconductor carbide, etc.), SOG, fluoride-doped silicate glass (FSG), phosphosilicate glass (PSG), borophosphosilicate glass (BPSG), Black Diamond®, Xerogel, Aerogel, amorphous fluorinated carbon, parylene, BCB, SiLK®, and/or combinations thereof.

Referring to block 104 of FIG. 1A and to FIG. 4, an etching process is performed that selectively removes the placeholder gate structure 302. Removing the placeholder gate structure 302 while leaving the sidewall spacers 304, CESL 306, and ILD layer 308 defines a gate recess 402 within which to form a functional gate structure. The etching processes may include any suitable etching technique such as wet etching, dry etching, Reactive Ion Etching (RIE), ashing, and/or other etching methods. In some embodiments, the etching process includes dry etching using an oxygen-based etchant, a fluorine-based etchant, a chlorine-based etchant, a bromine-based etchant, an iodine-based etchant, other suitable etchant gases or plasmas, and/or combinations thereof. In some embodiments, the etching process includes multiple stages using different etchants selected to etch particular materials of the placeholder gate structure (e.g., a first stage to selectively etch a dielectric gate cap, a second stage to selectively etch a polysilicon placeholder gate electrode, etc.).

Referring to block 106 of FIG. 1A and to FIG. 5, an interfacial layer 502 is formed on the top and side surfaces of the channel region 214 within the gate recess 402. The interfacial layer 502 may include any suitable material, such as a dielectric (e.g., a semiconductor oxide, a semiconductor nitride, a semiconductor oxynitride, a semiconductor carbide, a semiconductor carboxynitride, etc.) or other suitable material. The interfacial layer 502 may be formed by chemical oxidation, thermal oxidation, Atomic Layer Deposition (ALD), Chemical Vapor Deposition (CVD), and/or other suitable techniques. Accordingly, in some embodiments, the interfacial layer 502 includes silicon oxide and/or silicon-germanium oxide formed by thermal oxidation. The interfacial layer 502 may be formed to any suitable thickness and in various examples is between about 5 Å and about 20 Å thick. Some of the processes that follow may be tailored to prevent further growth of the interfacial layer 502 due to, for example, inadvertent oxidation of the channel region 214. Accordingly, the thickness of the interfacial layer 502 in the finished workpiece 200 may be substantially the same as the thickness at the conclusion of block 106. In further examples, the processes that follow actually thin the interfacial layer 502 such that the thickness of the interfacial layer 502 in the finished workpiece 200 is less than the thickness at the conclusion of block 106.

Referring to block 108 of FIG. 1A and referring still to FIG. 5, a gate dielectric layer 504 is formed on the interfacial layer 502 within the gate recess 402. In particular, the gate dielectric layer 504 may cover the interfacial layer 502 and may also extend vertically along the vertical side surfaces of the sidewall spacers 304.

Suitable materials for the gate dielectric layer 504 are commonly characterized by their dielectric constant (k) relative to silicon oxide. The gate dielectric layer 504 may include a high-k dielectric materials such as $HfO_2$, HfSiO, HfSiON, HfTaO, HfTiO, HfZrO, zirconium oxide ($ZrO_2$), lanthanum oxide ($La_2O_3$), titanium oxide ($TiO_2$), yttrium oxide ($Y_2O_3$), strontium titanate ($SrTiO_3$), aluminum oxide, hafnium dioxide-alumina ($HfO_2$—$Al_2O_3$) alloy, other suitable high-k dielectric materials, and/or combinations thereof. Compared to a silicon oxide gate dielectric layer, a high-k gate dielectric layer 504 may be thicker, which may reduce tunneling between the gate electrode and the channel region 214, reduce leakage, avoid dielectric breakdown, and increase transistor longevity. Furthermore, because a high-k gate dielectric layer 504 may be thicker overall, it becomes easier to tune parameters of individual transistors such as operating or threshold voltages by adjusting the thickness of the gate dielectric layer 504.

However, the gate dielectric layer 504 is not limited to high-k dielectric materials. Additionally or in the alternative, the gate dielectric layer 504 may include other dielectrics such as silicon nitride, silicon oxynitride, silicon carbide, amorphous carbon, tetraethylorthosilicate (TEOS), other suitable dielectric material, and/or combinations thereof.

The gate dielectric layer 504 may be formed by any suitable technique, such as ALD, Plasma Enhanced ALD (PEALD), CVD, or Plasma Enhanced CVD (PE CVD). The gate dielectric layer 504 may be formed to any suitable thickness, and in some examples, the gate dielectric layer 504 has a thickness between about 10 Å and about 30 Å.

Referring to block 110 of FIG. 1A and referring to FIG. 6, a first capping layer 602 is formed on the gate dielectric layer 504 within the gate recess 402. The first capping layer 602 may cover the horizontal surfaces of the gate dielectric layer 504 as well as the vertical surfaces of the gate dielectric layer 504 that extend along the sidewall spacers 304.

The first capping layer 602 may include any suitable protective material including metals (e.g., W, Al, Ta, Ti, Ni, Cu, Co, etc.), metal nitrides, and/or metal silicon nitrides. In various such embodiments, the first capping layer 602 includes TiSiN and/or TiN. In examples where the first capping layer 602 includes nitrogen, the first capping layer 602 may act as a nitrogen source for a passivation process where nitrogen is diffused into the high-k dielectric material of the gate dielectric layer 504 to compensate for oxygen vacancies in the high-k material.

The first capping layer 602 may be deposited via ALD, PEALD, CVD, PE CVD, Physical Vapor Deposition (PVD), and/or other suitable deposition process. In particular, the deposition process may be performed in an environment that is without oxygen to avoid penetrating oxidation of the channel region 214 that may increase the thickness of the interfacial layer 502. In some examples, the first capping layer 602 is deposited using ALD at a temperature between about 400° C. and about 550° C. at a pressure between about 3 torr and about 30 torr using $TiCl_4$ and $NH_3$ precursors. The deposition process may be configured to produce a first capping layer 602 with any suitable thickness, and in various examples, the first capping layer 602 has a thickness between about 10 Å and about 20 Å.

Referring to block 112 of FIG. 1A and referring still to FIG. 6, a second capping layer 604 is formed on the first capping layer 602 within the gate recess 402. In that regard, the second capping layer 604 may be formed conformally to cover the horizontal and the vertical surfaces of the first capping layer 602.

The second capping layer 604 may include any suitable protective material including metals, semiconductors, and nitrides thereof. The second capping layer 604 may be the same or different in composition from the first capping layer 602. In some embodiments, the second capping layer 604 includes amorphous silicon. In some embodiments, the second capping layer 604 includes aluminum and/or aluminum compounds.

The second capping layer 604 may be deposited via ALD, PEALD, CVD, PE CVD, PVD, and/or other suitable deposition process. In one such example, the second capping layer 604 includes silicon and is deposited by a silane ($SiH_4$) soak process where silane is introduced at a temperature between about 400° C. and about 550° C. at a pressure between about 3 torr and about 30 torr. Similar to the deposition of the first capping layer 602, the deposition process may be performed in an environment that is without oxygen to avoid penetrating oxidation of the channel region 214 that may increase the thickness of the interfacial layer 502. To further reduce the chance for inadvertent oxidation, the deposition of the first capping layer 602 and the second capping layer 604 may be performed in the same tool and/or chamber of a tool (i.e., in situ deposition). Performing deposition in the same tool and/or chamber avoids the risk of unintended oxidation or other reactions with the environment while transporting the workpiece 200. The deposition process may be configured to produce a second capping layer 604 with any suitable thickness, and in various examples, the second capping layer 604 has a thickness between about 5 Å and about 10 Å.

Figure 7:
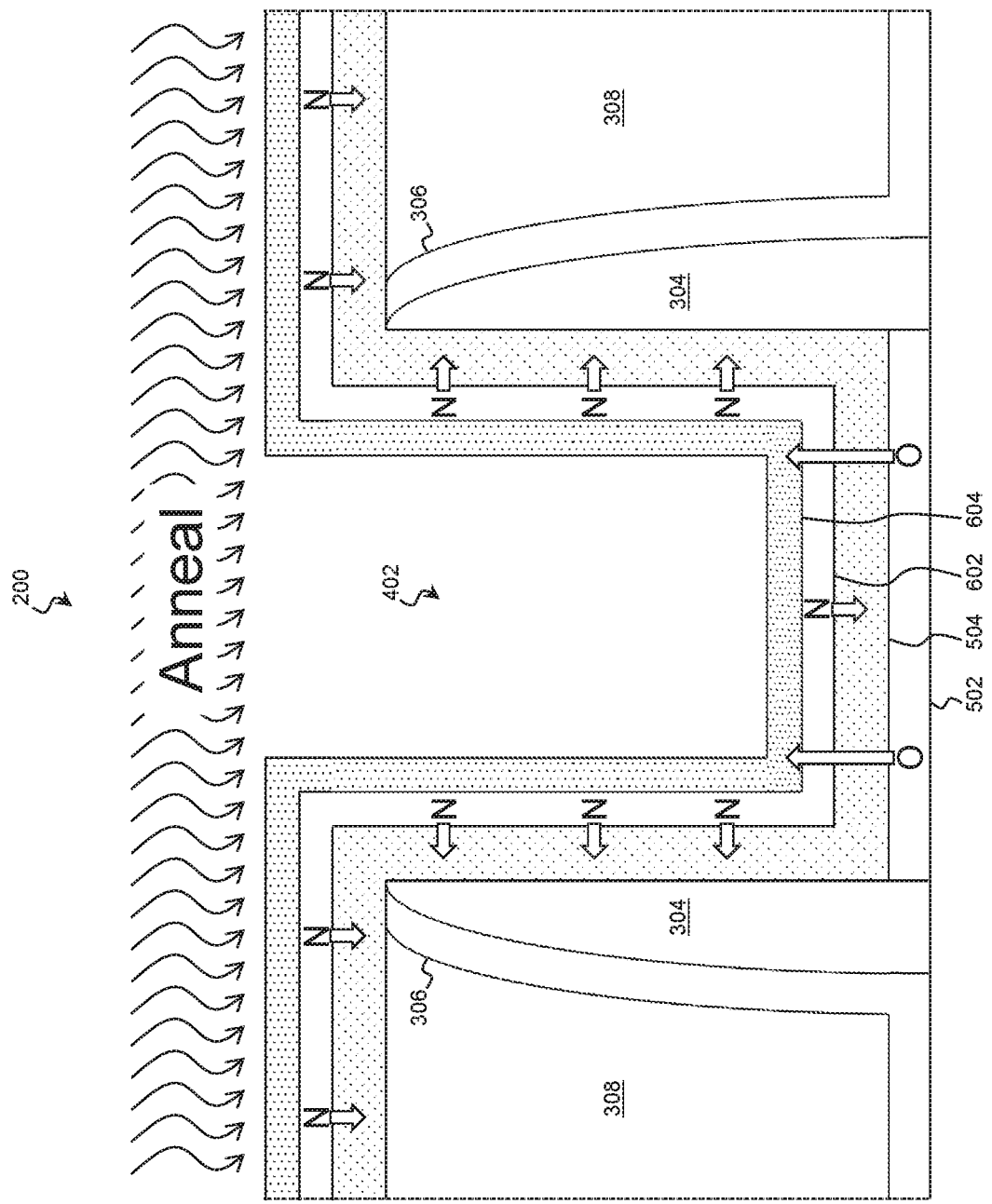

Referring to block 114 of FIG. 1A and to FIG. 7, a Post-Metal Anneal (PMA) process is performed on the workpiece 200. The PMA process is configured to cause nitrogen to diffuse from the first capping layer 602 into the high-k dielectric material of the gate dielectric layer 504. In more detail, as formed, the gate dielectric layer 504 may have defects produced by oxygen vacancies in the dielectric material. These defects can contribute to threshold voltage variations and may impair the reliability of the device. These defects may be resolved (i.e., the gate dielectric may be passivated) by driving atoms (e.g., nitrogen) from the first capping layer 602 and/or the annealing environment into the gate dielectric to fill the vacancies.

The PMA process may be performed at any suitable temperature for any suitable amount of time. In some examples, the PMA process includes heating the workpiece 200 to temperature between about 600° C. and about 800° C. for a soak in an $NH_3$ ambient environment for between about 10 second and about 60 seconds with a spike annealing performed at a temperature between about 850° C. and about 950° C.

Similar to blocks 110 and 112, the PMA annealing may be performed in an environment that is without oxygen to avoid penetrating oxidation of the channel region 214 that may increase the thickness of the interfacial layer 502. To further reduce the chance for inadvertent oxidation, the PMA annealing may be performed in the same tool and/or chamber (i.e., in situ annealing) as the deposition of the first capping layer 602 and/or the second capping layer 604.

In addition to diffusing nitrogen into the gate dielectric layer 504, the PMA process may cause oxygen in the interfacial layer 502 to diffuse outward into the second capping layer 604. As a result, the interfacial layer 502 may be thinner at the conclusion of block 114 than it was at deposition in block 106. In this way, the present technique may not only avoid increasing the thickness of the interfacial layer 502, the method 100 may actually reduce the thickness. By way of example, the interfacial layer 502 may be between about 5 Å and about 20 Å thick at deposition and may remain between about 5 Å and about 20 Å thick at the conclusion of block 114.

Figure 8:
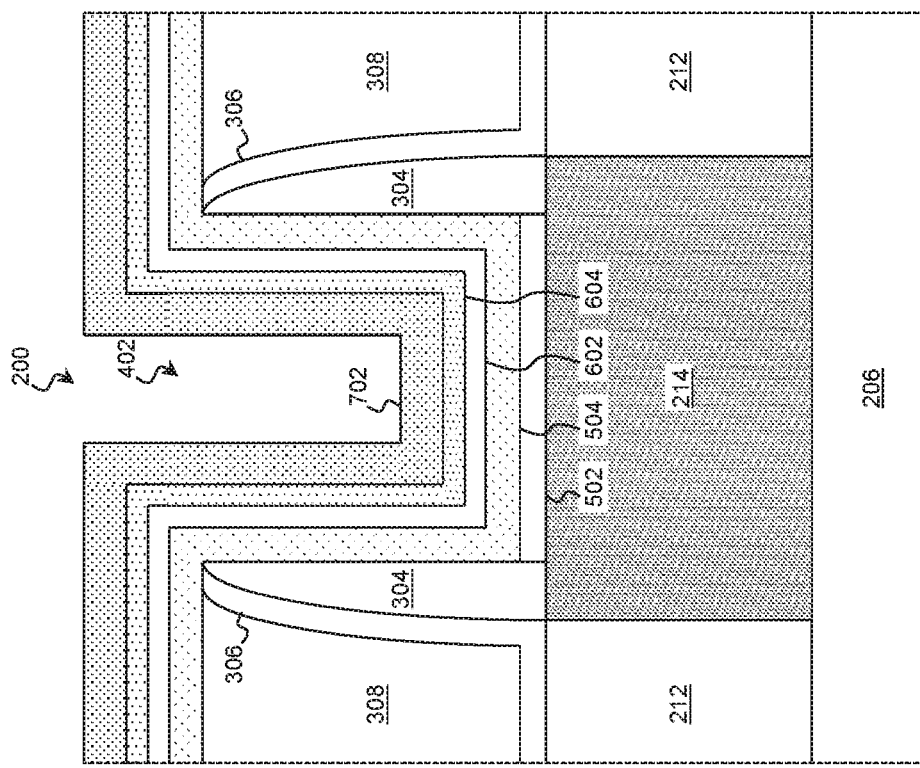

Referring to block 116 of FIG. 1A and referring to FIG. 8, a third capping layer 702 is formed on the second capping layer 604 within the gate recess 402. The third capping layer 702 may be formed conformally to cover the horizontal and the vertical surfaces of the second capping layer 604.

The third capping layer 702 may include any suitable protective material including metals, semiconductors, and nitrides thereof. The third capping layer 702 may be the same or different in composition from the first capping layer 602 and second capping layer 604. In some embodiments, the third capping layer 702 is substantially similar to the second capping layer 604 and includes amorphous silicon. In some embodiments, the third capping layer 702 is substantially similar to the second capping layer 604 and includes aluminum and/or aluminum compounds.

The third capping layer 702 may be deposited via ALD, PEALD, CVD, PE CVD, PVD, and/or other suitable deposition process, and in an example, includes amorphous silicon deposited via CVD at a temperature between about 350° C. and about 500° C. at a pressure between about 0.3 torr and about 30 torr using $Si_2H_6$ as a precursor. Because of the presence of the second capping layer 604, the other materials of the gate structure may no longer need protection from oxygen. Accordingly, the deposition process for the third capping layer 702 may be performed in a different chamber or tool. The transition between chambers or tools may represent the first time the workpiece 200 is exposed to an uncontrolled environment since the deposition of the first capping layer 602.

The deposition process may be configured to produce a third capping layer 702 with any suitable thickness. In some examples, the third capping layer 702 has a thickness between about 20 Å and about 50 Å and is substantially thicker than the second capping layer 604, which has a thickness in these examples of between about 10 Å and about 20 Å. In some examples, the third capping layer 702 has a thickness between about 10 Å and about 20 Å and is substantially the same thickness as the second capping layer 604.

Figure 9:
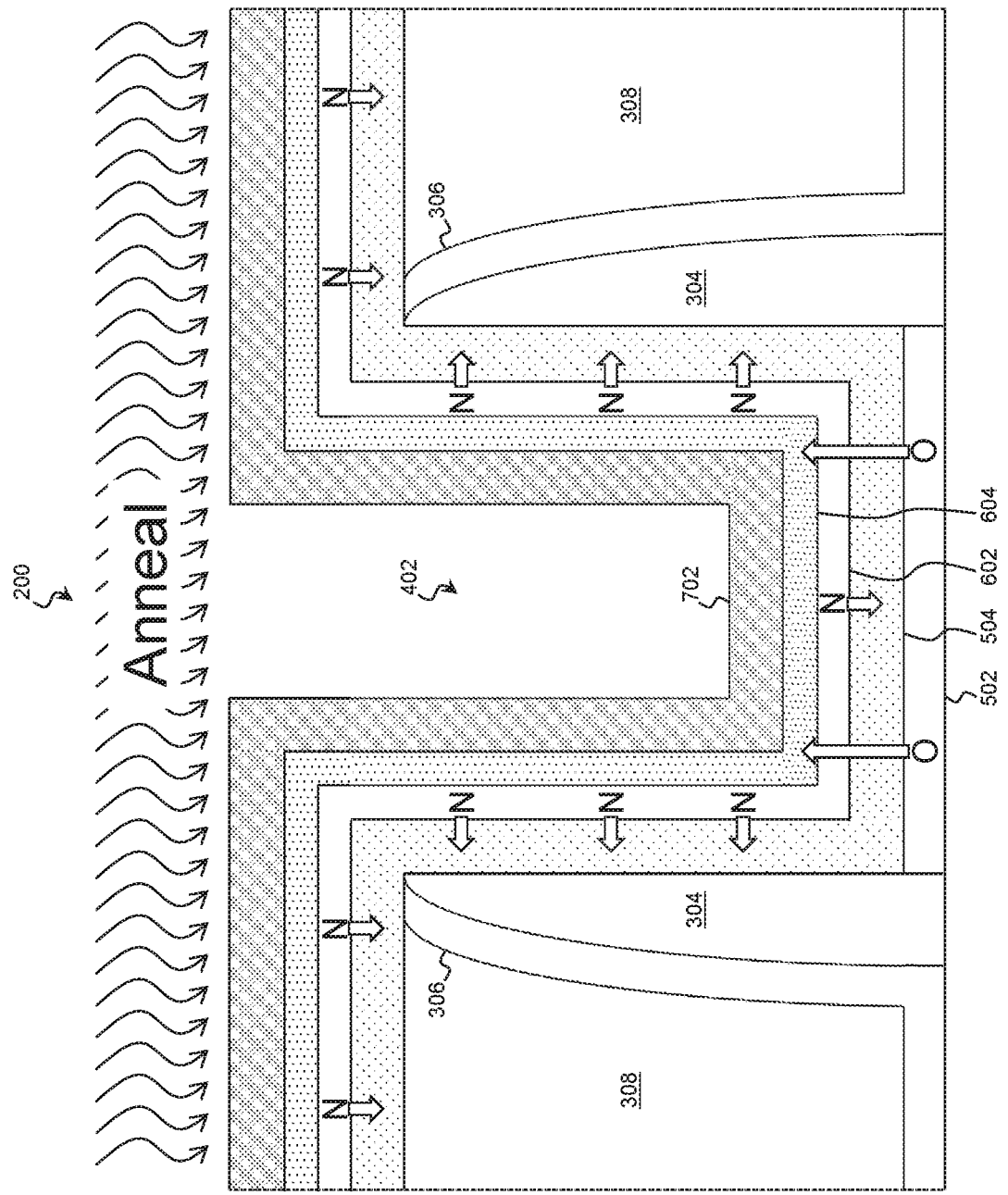

Referring to block 118 of FIG. 1B and to FIG. 9, a Post-Cap Annealing (PCA) process is performed on the workpiece 200. Similar to the PMA process, the PCA process may be configured to cause nitrogen to diffuse from the first capping layer 602 and/or the annealing environment into the high-k dielectric material of the gate dielectric layer 504 and may cause oxygen in the interfacial layer 502 to diffuse outward into the second capping layer 604 and/or the third capping layer 702. As a result, the interfacial layer 502 may be thinner at the conclusion of block 118 than it was at deposition in block 106. By way of example, the interfacial layer 502 may be between about 5 Å and about 20 Å thick at deposition and may remain between about 5 Å and about 20 Å thick at the conclusion of block 118.

The PCA process may be performed at any suitable temperature for any suitable duration, and may be conducted substantially similar to the PMA process of block 114. In some examples, the PCA process includes heating the workpiece 200 to temperature between about 600° C. and about 800° C. for a soak in an $N_2$ ambient environment for between about 10 second and about 60 seconds with a spike annealing performed at a temperature between about 850° C. and about 950° C.

Figure 10:
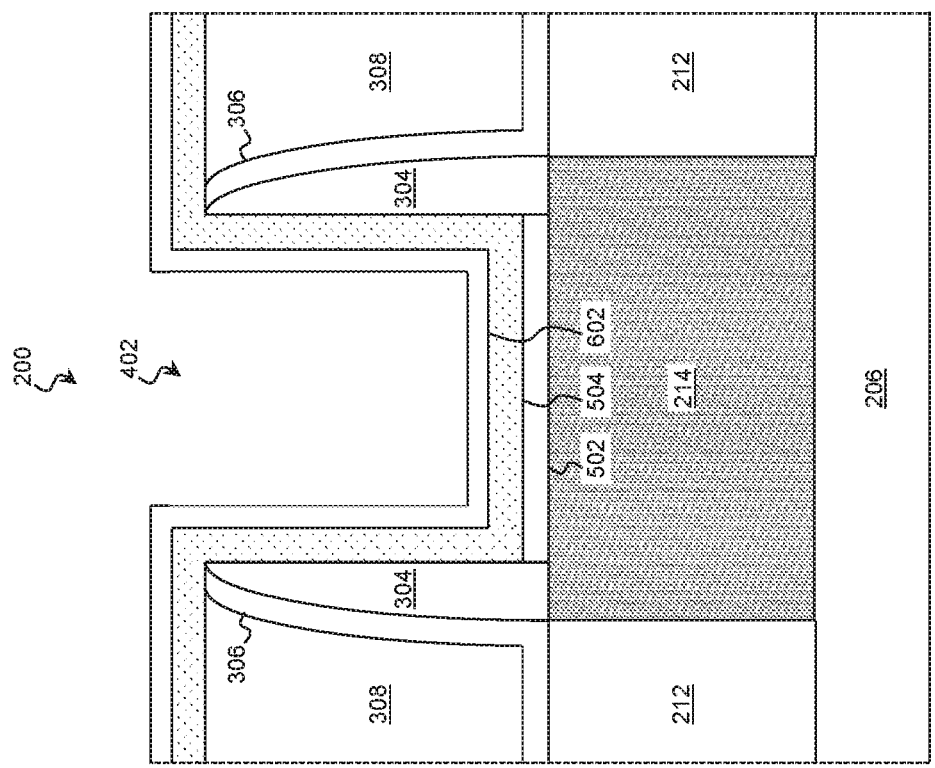

Referring to block 120 of FIG. 1B and to FIG. 10, an etching process is performed on the workpiece 200 to remove the second capping layer 604 and the third capping layer 702. The etching processes may include any suitable etching technique such as wet etching, dry etching, RIE, ashing, and/or other etching methods. The etching process may use any suitable etchant, and the technique and etchant chemistry may be selected to selectively etch the second capping layer 604 and the third capping layer 702 without significant etching of any surrounding material such as that of the first capping layer 602.

It is noted that some etching techniques and materials may leave a residue of the second capping layer 604 on a topmost surface of the first capping layer 602. In some examples, residual silicon from a silicon-containing second capping layer remains on the topmost surface of the first capping layer 602 particularly when used in conjunction with a nitrogen-containing high-k gate dielectric layer 504 (e.g., ALD TiN with less than about 2.3 atomic percent of nitrogen).

The metal layers that make up the gate electrode may then be deposited. While the interfacial layer 502, the gate dielectric layer 504, and the above capping layers may be substantially the same for pMOS and nMOS transistors of the workpiece 200, some of the metal layers of the gate electrode may differ. Accordingly, FIGS. 11-15 illustrate a first region 902 of the workpiece 200 for forming pMOS transistors and second region 904 of the same workpiece 200 for forming nMOS transistors.

Figure 11:
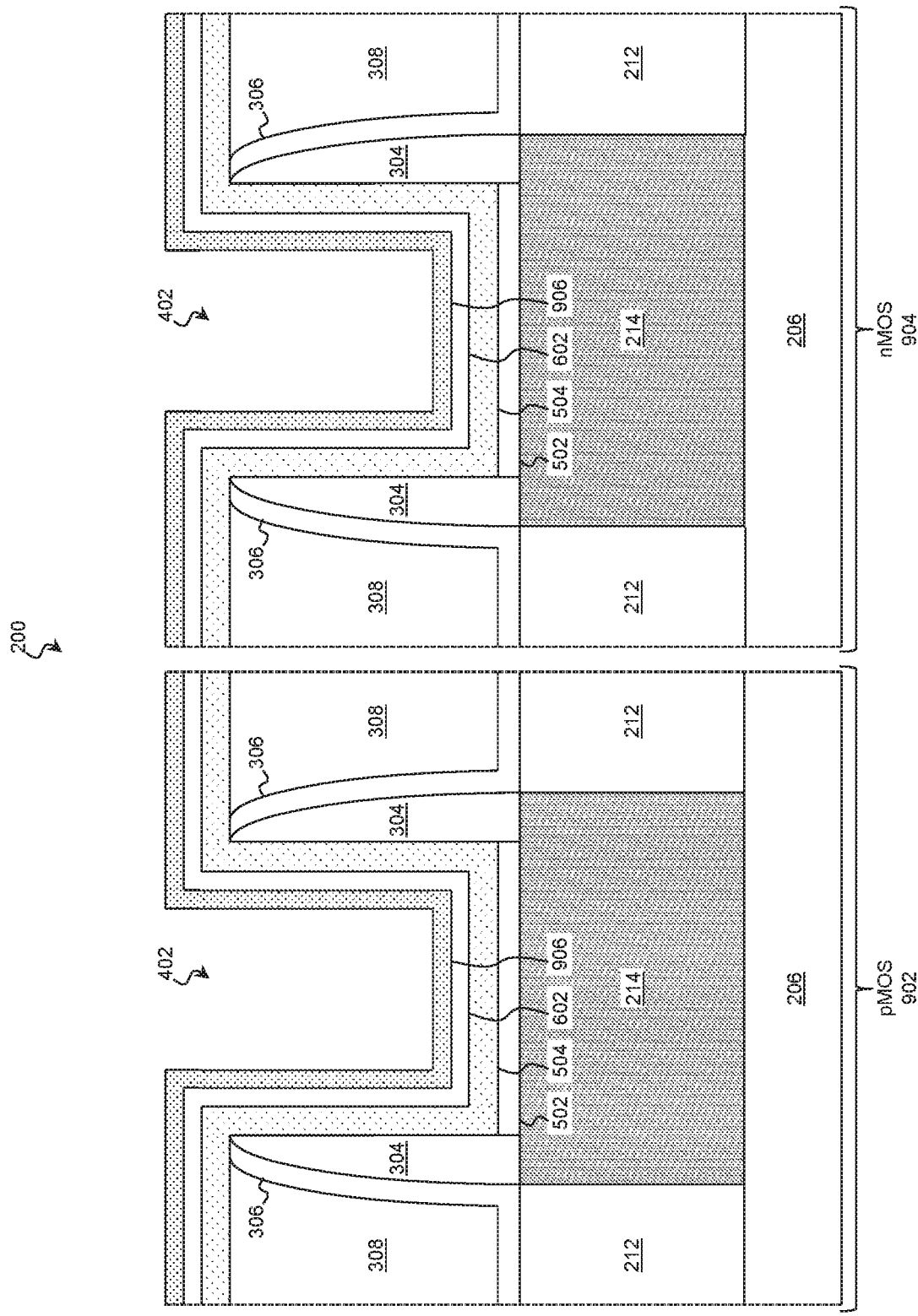

Referring to block 122 of FIG. 1B and to FIG. 11, a barrier layer 906 is formed on the first capping layer 602 within the gate recesses 402 in both the pMOS region 902 and the nMOS region 904. The barrier layer 906 may contain any suitable material including metals and metal nitrides, such as Ta, TaN, Ti, TiN, W, Ru, or combinations thereof. Materials for the barrier layer 906 may be selected based on their resilience to diffusion into the first capping layer 602, the gate dielectric layer 504, and the sidewall spacers 304. The barrier layer 906 may be deposited by any suitable technique including ALD, PEALD, CVD, PE CVD, PVD (e.g., sputtering), and/or combinations thereof.

Figure 12:
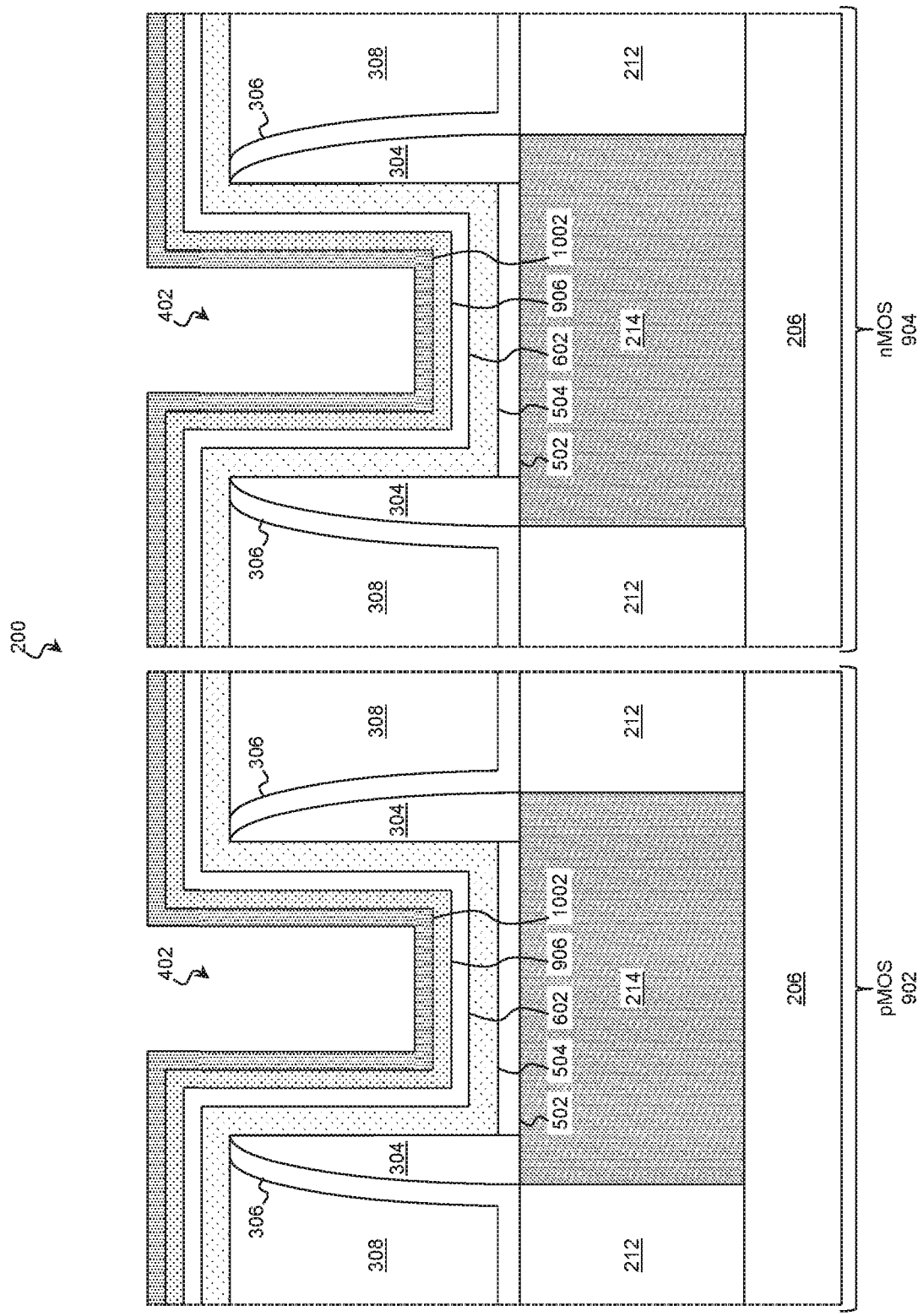
Figure 13:
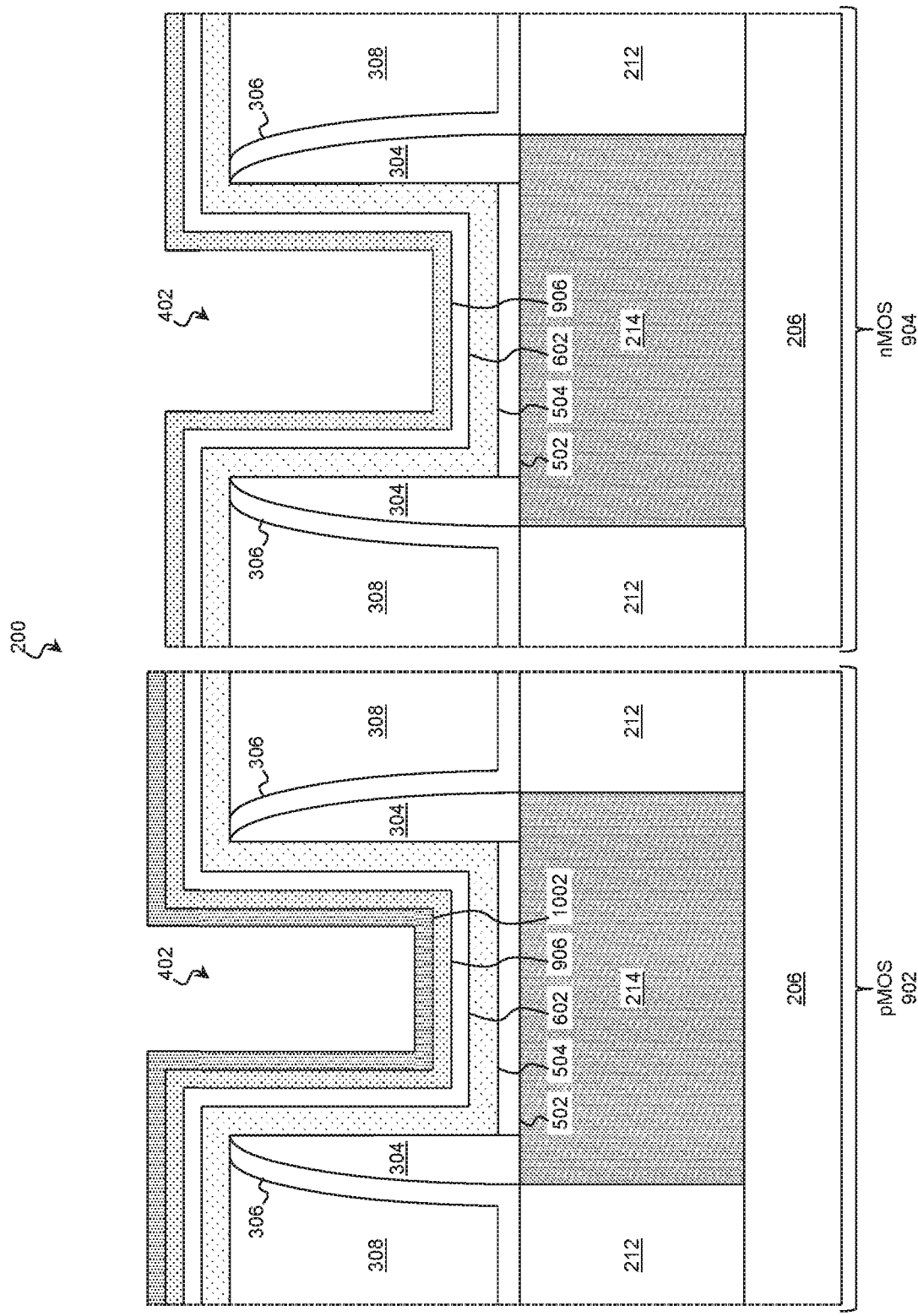
Figure 14:
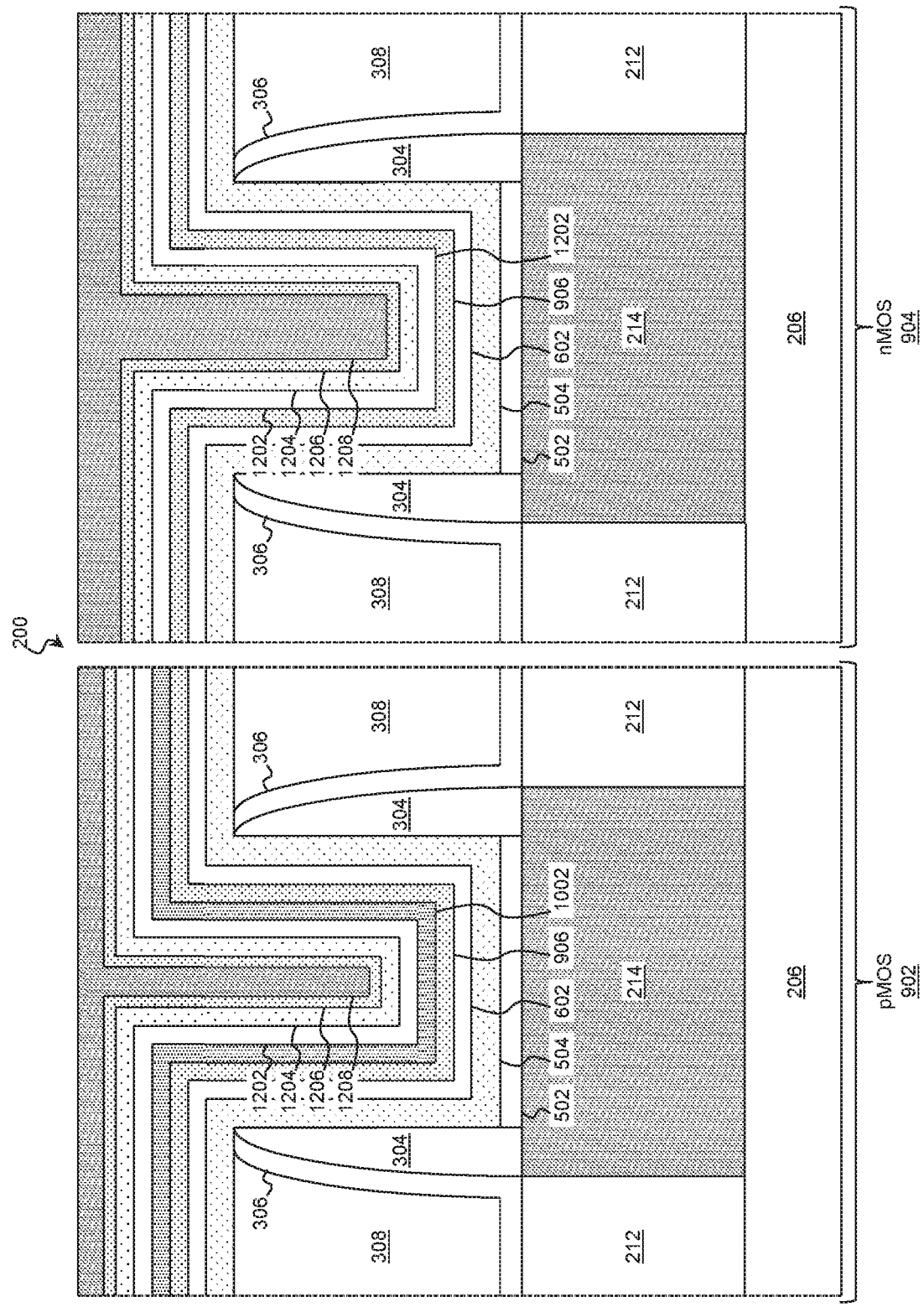

Referring to block 124 of FIG. 1B and referring to FIGS. 12-14, one or more work function layers are formed within the gate recesses 402 on the barrier layer 906. Suitable work function layer materials include n-type and/or p-type work function materials based on the type of device to which the gate stack corresponds. Exemplary p-type work function materials include TiN, TaN, Ru, Mo, Al, WN, $ZrSi_2$, $MoSi_2$, $TaSi_2$, $NiSi_2$, WN, other suitable p-type work function materials, and/or combinations thereof. Exemplary n-type work function materials include Ti, Ag, TaAl, TaAlC, TiAlN, TaC, TaCN, TaSiN, Mn, Zr, other suitable n-type work function materials, and/or combinations thereof. The work function layer(s) may be deposited by any suitable technique including ALD, PEALD, CVD, PE CVD, PVD, and/or combinations thereof.

In an example, a p-type work function layer 1002 (e.g., TiN) is deposited within the gate recesses 402 of the pMOS region 902 and the nMOS region 904 as illustrated in FIG. 12. After depositing, the portion of the p-type work function layer 1002 within the pMOS region 902 may be protected by a photoresist and/or other resist material while the portion within the nMOS region 904 is exposed. The exposed portion of the p-type work function layer 1002 in the nMOS region 904 may then be etched in an etching process configured to avoid significant etching of the surrounding materials such as the barrier layer 906. This may leave the portion of the p-type work function layer 1002 in the pMOS region 902 unetched as illustrated in FIG. 13. Any remaining resist material may be removed after the etching.

Continuing the example, an n-type work function layer 1202 (e.g., TiAlC) is deposited within the gate recesses 402 of the pMOS region 902 and the nMOS region 904 as illustrated in FIG. 14. The n-type work function layer 1202 may be allowed to remain in the pMOS region 902 as the p-type work function layer 1002, being closer to the channel region 214, may dominate the work function of the gate structure.

Referring to block 126 of FIG. 1B and referring still to FIG. 14, a fourth capping layer 1204 is formed on the work function layer(s) 1002 and 1202 within the gate recess 402. The fourth capping layer 1204 may contain any suitable protective material including metals, metal nitrides, and/or metal silicon nitrides, and in an example, the fourth capping layer 1204 includes TiN. The fourth capping layer 1204 may be deposited by any suitable technique including ALD, PEALD, CVD, PE CVD, PVD, and/or combinations thereof.

Referring to block 128 of FIG. 1B and referring still to FIG. 14, a glue layer 1206 is formed on the fourth capping layer 1204 within the gate recess 402. The glue layer 1206 may contain any suitable material selected to promote adhesion between layers and may include metals, metal nitrides, and/or metal silicon nitrides, and in an example, the glue layer 1206 includes tungsten. The glue layer 1206 may be deposited by any suitable technique including ALD, PEALD, CVD, PE CVD, PVD, and/or combinations thereof. In an embodiment, a tungsten-containing glue layer 1206 is formed using ALD in a fluorine-free deposition process.

Referring to block 130 of FIG. 1B and to referring still to FIG. 14, an electrode fill 1208 is formed within the gate recesses 402 on the glue layer 1206. The electrode fill 1208 may include any suitable material including metals, metal oxides, metal nitrides and/or combinations thereof, and in an example, the electrode fill 1208 includes tungsten. The electrode fill 1208 may be deposited by any suitable technique including ALD, PEALD, CVD, PE CVD, PVD, and/or combinations thereof.

Figure 15:
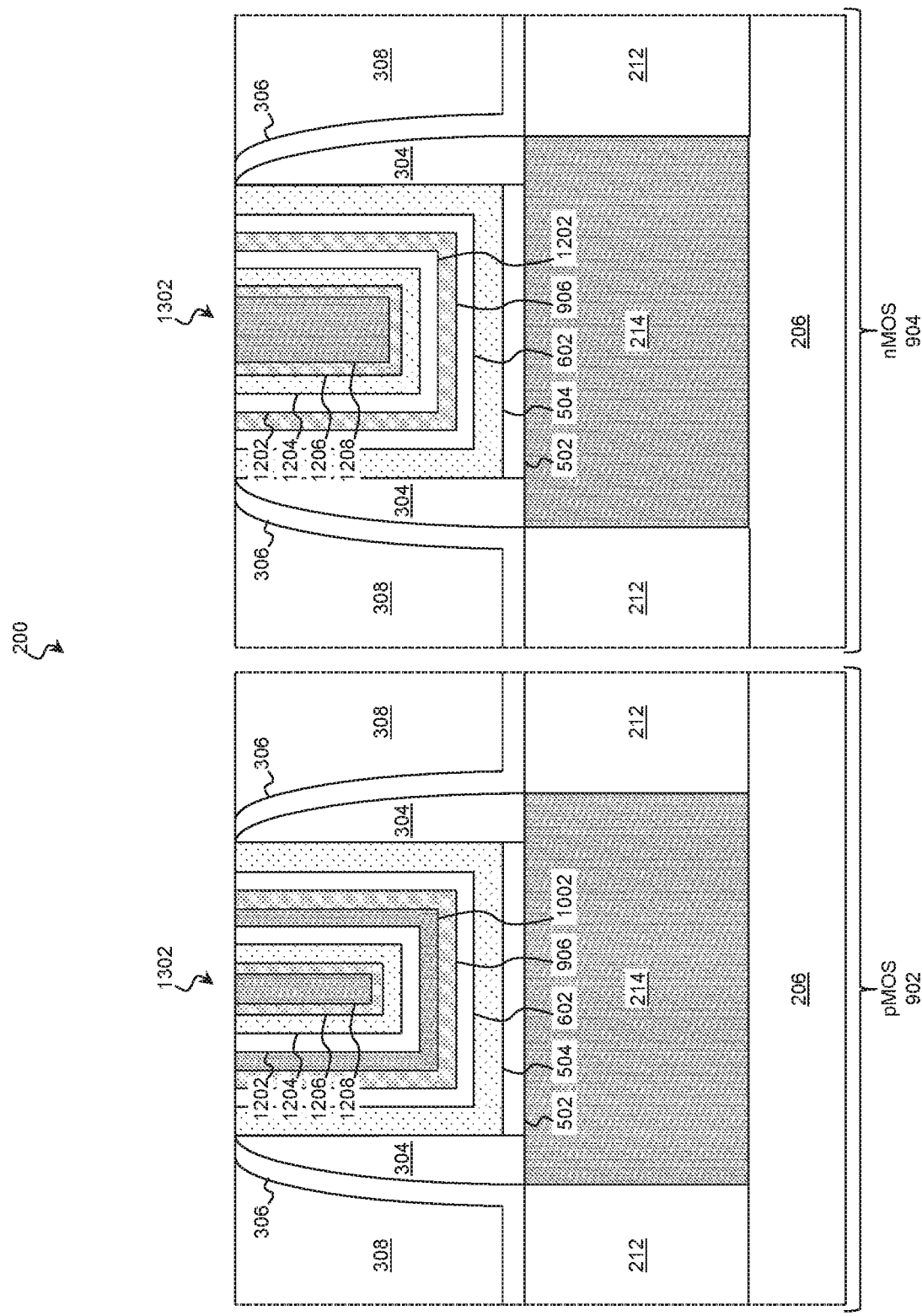

Referring to block 132 of FIG. 1B and to FIG. 15, a Chemical Mechanical Planarization/Polishing (CMP) process may be performed to remove material that is outside of the gate structure 1302 (e.g., material of: the gate dielectric layer 504, the first capping layer 602, the barrier layer 906, the work function layer(s) 1002 and 1202, the fourth capping layer 1204, the glue layer 1206, the electrode fill 1208, etc.).

Referring to block 134 of FIG. 1B, the workpiece 200 is provided for further fabrication. In various examples, further fabrication includes forming contacts electrically coupled to the gate structure 1302 and the source/drain features 212, forming a remainder of an electrical interconnect structure, dicing, packaging, and other fabrication processes.

Figure 16:
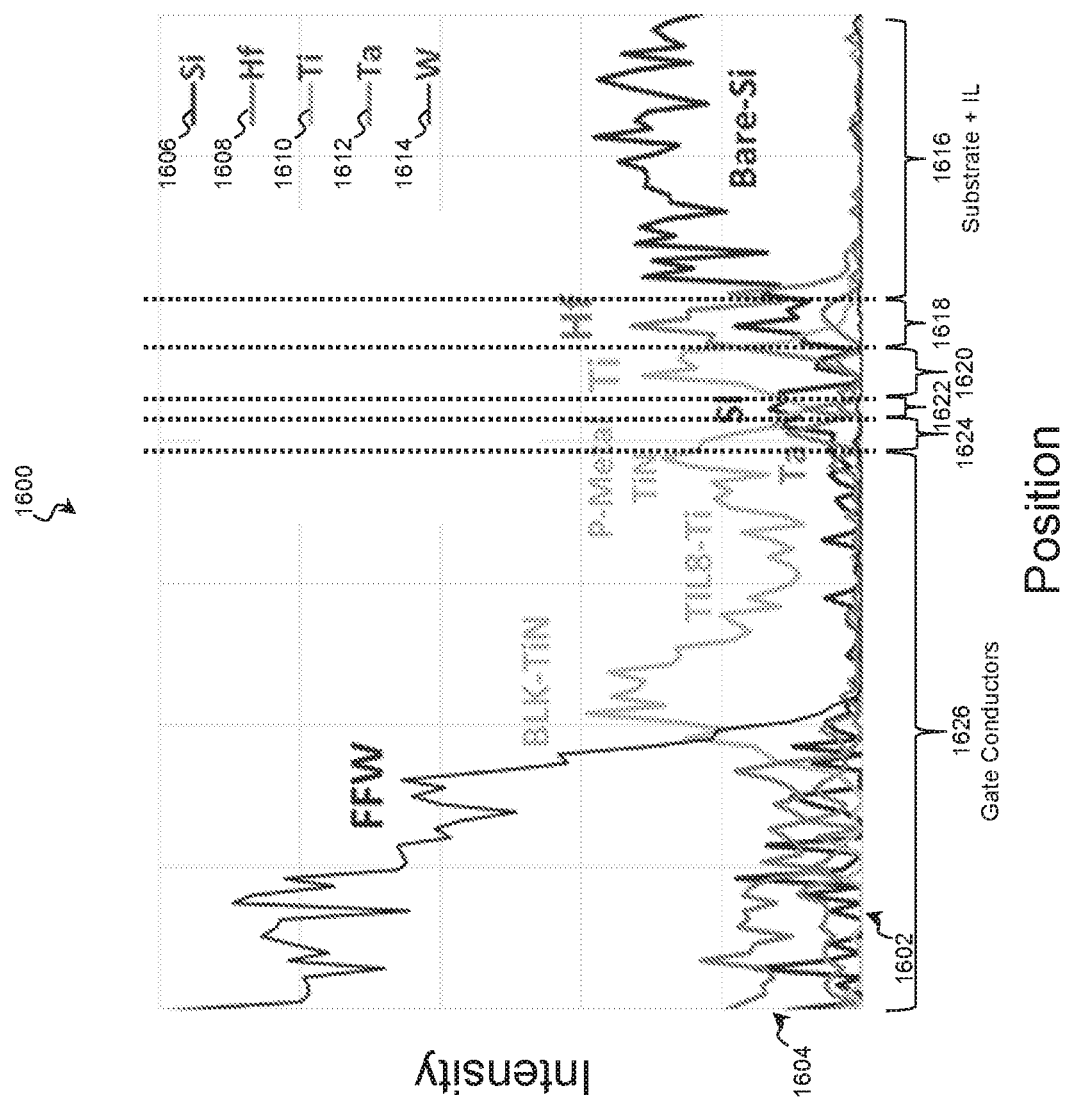
FIG. 16 is a graph of material composition for a workpiece according to various aspects of the present disclosure.

FIG. 16 is a graph 1600 of material composition for an example workpiece according to various aspects of the present disclosure. The workpiece may be substantially similar to the workpiece 200 of FIGS. 2-15 and may be formed by the method 100 of FIGS. 1A-1B. The graph 1600 may be produced by Energy Dispersive Spectroscopy (EDS) or other suitable techniques and includes a first axis 1602 representing position and a second axis 1604 representing the intensity of a signal corresponding to a particular material. Signal 1606 corresponds to silicon, signal 1608 corresponds to hafnium, signal 1610 corresponds to titanium, signal 1612 corresponds to tantalum, and signal 1614 corresponds to tungsten. Any given technique may be more sensitive to some materials than others, and thus the magnitudes of the signals 1606-1614 may not be directly comparable. However, by comparing the change in a given signal, the relative amount of the corresponding material at a given position can be determined.

In the example, graph 1600 has a first region 1616 that corresponds to the substrate 206 and interfacial layer 502. The first region 1616 is predominantly silicon. A second region 1618 corresponds to the gate dielectric layer 504 and is predominantly hafnium and silicon with some tantalum. A third region 1620 corresponds to the first capping layer 602 and is predominantly titanium in the form of TiN. As noted above in the context of block 120, the workpiece may include a silicon residue found in a fourth region 1622 between the first capping layer 602 and the barrier layer 906. Fifth region 1624 corresponds to the barrier layer 906 and includes tantalum in the form of TaN and some titanium.

The graph 1600 has a sixth region 1626 that corresponds to the conductors of the gate stack (e.g., p-type work function layer 1002, n-type work function layer 1202, fourth capping layer 1204, glue layer 1206, electrode fill 1208, etc.). The sixth region 1626 includes titanium and tungsten.

Thus, the present disclosure provides examples of an improved method for forming an integrated circuit device with an improved interfacial layer between a channel region and a gate dielectric. In some embodiments, the method of fabricating an integrated circuit includes receiving a workpiece having a substrate and a fin having a channel region disposed on the substrate. An interfacial layer is formed on the channel region of the fin, and a gate dielectric layer is formed on the interfacial layer. A first capping layer is formed on the gate dielectric layer, and a second capping layer is formed on the first capping layer. An annealing process is performed on the workpiece configured to cause a first material to diffuse from the first capping layer into the gate dielectric layer. In some such embodiments, the forming of the first capping layer and the forming of the second capping layer are performed in a first chamber of a fabrication tool. In some such embodiments, the annealing process is performed in the first chamber of the fabrication tool. In some such embodiments, the annealing process is configured to cause oxygen to diffuse out of the interfacial layer. In some such embodiments, the annealing process is a first annealing process, and the method further includes: forming a third capping layer on the second capping layer, and performing a second annealing process on the workpiece. In some such embodiments, the second annealing process is configured to cause oxygen to diffuse out of the interfacial layer. In some such embodiments, a thickness of the second capping layer is substantially the same as a thickness of the third capping layer. In some such embodiments, the third capping layer has substantially the same composition as the second capping layer. In some such embodiments, the second capping layer includes amorphous silicon and/or aluminum. In some such embodiments, the first capping layer includes a metal nitride, and the first material includes nitrogen.

In further embodiments, the method includes receiving a workpiece that, in turn, includes a substrate, a semiconductor fin disposed on the substrate, and a pair of dielectric features disposed on the semiconductor fin such that a gate trench extends between the pair of dielectric features. An interfacial layer is formed on the substrate within the gate trench, and a high-k gate dielectric is formed on the interfacial layer within the gate trench. Furthermore, a first capping layer is formed on the high-k gate dielectric within the gate trench, and a second capping layer is formed on the first capping layer within the gate trench. An annealing process is performed on the workpiece that is configured to draw oxygen from the interfacial layer. In some such embodiments, the forming of the first capping layer, the forming of the second capping layer, and the performing of the annealing process are performed in a single chamber of a fabrication tool. In some such embodiments, the first capping layer includes a metal nitride and the annealing process is further configured to diffuse nitrogen from the first capping layer into the high-k gate dielectric. In some such embodiments, the second capping layer includes a material from a group consisting of: silicon and aluminum. In some such embodiments, the annealing process is a first annealing process, and the method further includes forming a third capping layer on the second capping layer within the gate trench, and performing a second annealing process on the workpiece that is configured to draw oxygen from the interfacial layer. In some such embodiments, the second capping layer and the third capping layer are removed, and a gate structure is formed that includes the interfacial layer, the high-k gate dielectric, and the first capping layer.

In yet further embodiments, the method includes receiving a substrate having a channel region. An interfacial layer is formed on the channel region, and a gate dielectric is formed on the interfacial layer. A first capping layer on the gate dielectric, and a second capping layer is formed on the first capping layer. The second capping layer has a composition different from the first capping layer. A first annealing process is performed on the substrate having the second capping layer. The first annealing process is configured to diffuse nitrogen from the first capping layer into the gate dielectric. A third capping layer is formed on the second capping layer, and a second annealing process is performed on the substrate having the third capping layer. The second capping layer and the third capping layer are then removed. In some such embodiments, the forming of the first capping layer, the forming of the second capping layer, and the performing of the first annealing process are performed in a same chamber of a fabrication tool. In some such embodiments, the performing of the first annealing process is further configured to draw oxygen from the interfacial layer. In some such embodiments, the performing of the second annealing process is further configured to draw oxygen from the interfacial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an integrated circuit comprising:
  receiving a workpiece having a substrate and a fin disposed on the substrate, wherein the fin has a channel region defined therein;

forming an interfacial layer on the channel region of the fin;
forming a gate dielectric layer on the interfacial layer;
forming a first capping layer on the gate dielectric layer;
forming a second capping layer on the first capping layer; and
performing a first annealing process on the workpiece configured to cause oxygen to diffuse from the first capping layer into the gate dielectric layer;
forming a third capping layer on the second capping layer; and
performing a second annealing process on the workpiece, wherein the second annealing process is configured to cause oxygen to diffuse out of the interfacial layer.

2. The method of claim 1, wherein the forming of the first capping layer and the forming of the second capping layer are performed in a first chamber of a fabrication tool.

3. The method of claim 2, wherein the annealing process is performed in the first chamber of the fabrication tool.

4. The method of claim 1, wherein a thickness of the second capping layer is substantially the same as a thickness of the third capping layer.

5. The method of claim 1, wherein the third capping layer has substantially the same composition as the second capping layer.

6. The method of claim 1, wherein the second capping layer includes a material from a group consisting of: amorphous silicon and aluminum.

7. The method of claim 1, wherein the first capping layer includes a metal nitride, and wherein the first material includes nitrogen.

8. A method comprising:
receiving a workpiece that includes:
a substrate;
a semiconductor fin disposed on the substrate; and
a pair of dielectric features disposed on the semiconductor fin such that a gate trench extends between the pair of dielectric features;
forming an interfacial layer on the substrate within the gate trench;
forming a high-k gate dielectric on the interfacial layer within the gate trench;
forming a first capping layer on the high-k gate dielectric within the gate trench;
forming a second capping layer on the first capping layer within the gate trench; and
performing a first annealing process on the workpiece, wherein the first annealing process is configured to draw oxygen from the interfacial layer; and
forming a third capping layer on the second capping layer within the gate trench; and
performing a second annealing process on the workpiece, wherein the second annealing process is configured to draw oxygen from the interfacial layer.

9. The method of claim 8, wherein the forming of the first capping layer, the forming of the second capping layer, and the performing of the annealing process are performed in a single chamber of a fabrication tool.

10. The method of claim 8, wherein the first capping layer includes a metal nitride and the annealing process is further configured to diffuse nitrogen from the first capping layer into the high-k gate dielectric.

11. The method of claim 8, wherein the second capping layer includes a material from a group consisting of: silicon and aluminum.

12. The method of claim 8, further comprising:
removing the second capping layer and the third capping layer; and
forming a gate structure that includes the interfacial layer, the high-k gate dielectric, and the first capping layer.

13. A method comprising:
receiving a substrate having a channel region defined thereupon;
forming an interfacial layer on the channel region;
forming a gate dielectric on the interfacial layer;
forming a first capping layer on the gate dielectric;
forming a second capping layer on the first capping layer, the second capping layer having a composition different from the first capping layer;
performing a first annealing process on the substrate having the second capping layer, wherein the first annealing process is configured to diffuse nitrogen from the first capping layer into the gate dielectric;
forming a third capping layer on the second capping layer;
performing a second annealing process on the substrate having the third capping layer wherein the performing of the second annealing process is further configured to draw oxygen from the interfacial layer; and
removing the second capping layer and the third capping layer.

14. The method of claim 13, wherein the forming of the first capping layer, the forming of the second capping layer, and the performing of the first annealing process are performed in a same chamber of a fabrication tool.

15. The method of claim 13, wherein the performing of the first annealing process is further configured to draw oxygen from the interfacial layer.

16. The method of claim 13, further comprising forming a work function metal layer on the first capping layer after removing the second capping layer and the third capping layer.

17. The method of claim 8, wherein the forming of the third capping layer on the second capping layer within the gate trench occurs after the performing of the first annealing process on the workpiece.

18. The method of claim 1, wherein the interfacial layer has a first thickness after forming the interfacial layer on the channel region of the fin, and
wherein the interfacial layer has a second thickness after performing the first annealing process on the workpiece, the second thickness being less than the first thickness.

19. The method of claim 18, wherein the interfacial layer has a third thickness after performing the second annealing process on the workpiece, the third thickness being less than the second thickness.

20. The method of claim 1, further comprising:
removing the second capping layer and the third capping layer to expose a portion of the first capping layer; and
forming a work function metal layer directly on the exposed first capping layer.

* * * * *